(12) United States Patent
Han et al.

(10) Patent No.: US 8,507,930 B2
(45) Date of Patent: Aug. 13, 2013

(54) ORGANIC LIGHT EMITTING DIODE DISPLAY INCLUDING A SEALANT AUXILIARY STRUCTURE AND METHOD OF MANUFACTURING THE SAME

(75) Inventors: Byung-Uk Han, Yongin (KR); Hee-Chul Jeon, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 134 days.

(21) Appl. No.: 12/950,719

(22) Filed: Nov. 19, 2010

(65) Prior Publication Data

US 2011/0122633 A1    May 26, 2011

(30) Foreign Application Priority Data

Nov. 20, 2009  (KR) .................. 10-2009-0112857

(51) Int. Cl.
*H01L 33/00*  (2010.01)
*H01L 21/00*  (2006.01)

(52) U.S. Cl.
USPC ........ 257/98; 257/432; 257/E51.026; 438/25; 438/456; 438/458

(58) Field of Classification Search
None
See application file for complete search history.

(56) References Cited

U.S. PATENT DOCUMENTS

| 5,874,804 | A  | * | 2/1999 | Rogers | 313/512 |
|---|---|---|---|---|---|
| 6,724,143 | B2 | * | 4/2004 | Chen et al. | 313/512 |
| 8,125,146 | B2 | * | 2/2012 | Park | 313/512 |
| 2005/0014022 | A1 | * | 1/2005 | Park | 428/690 |
| 2006/0049396 | A1 | * | 3/2006 | Pichler et al. | 257/40 |
| 2008/0108173 | A1 | * | 5/2008 | Park et al. | 438/99 |

FOREIGN PATENT DOCUMENTS

| JP | 2006-126541 | 5/2006 |
|---|---|---|
| JP | 2007-094039 | 4/2007 |
| JP | 2007-101688 | 4/2007 |
| KR | 1019990081659 A | 11/1999 |
| KR | 10-2004-0010918 A | 2/2004 |
| KR | 1020050010333 A | 1/2005 |
| KR | 100893864 B1 | 4/2009 |

* cited by examiner

*Primary Examiner* — Alonzo Chambliss
(74) *Attorney, Agent, or Firm* — Robert E. Bushnell, Esq.

(57) ABSTRACT

An organic light emitting diode (OLED) display includes: a first substrate including an OLED; a second substrate that is opposite to the first substrate; a sealant that is positioned between the first substrate and the second substrate and that couples the first substrate and the second substrate; and a sealant contraction reinforcement auxiliary structure that is positioned in at least one of a position between the first substrate and the sealant and a position between the second substrate and the sealant.

18 Claims, 14 Drawing Sheets

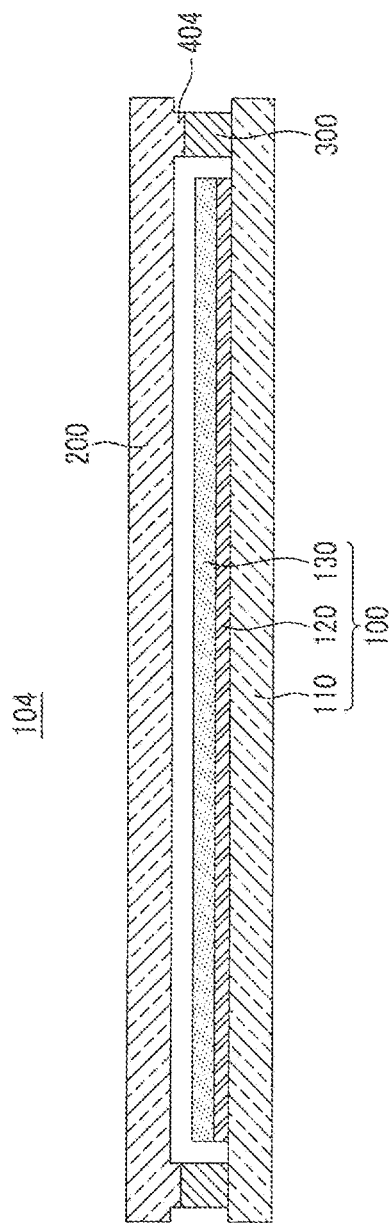

ORGANIC LIGHT EMITTING DIODE DISPLAY INCLUDING A SEALANT AUXILIARY STRUCTURE AND METHOD OF MANUFACTURING THE SAME

CROSS-REFERENCE TO RELATED APPLICATION

This application claims priority to and the benefit of Korean Patent Application No. 10-2009-0112857 filed in the Korean Intellectual Property Office on Nov. 20, 2009, the entire contents of which are incorporated herein by reference.

BACKGROUND OF THE INVENTION

1. Field of the Invention

The present invention relates to an organic light emitting diode (OLED) display. More particularly, the present invention relates to an OLED display including an OLED and a method of manufacturing an OLED display.

2. Description of the Related Art

A display device is a device that displays an image, and currently, an OLED display is in the spotlight.

An OLED display has self luminous characteristics and does not require a separate light source, unlike a liquid crystal display (LCD), and thus can have reduced thickness and weight. Further, the OLED display has high quality characteristics such as low power consumption, high luminance, and a high reaction speed.

An OLED display includes a first substrate including an OLED that emits light, a second substrate that is opposite to the first substrate, and a sealant that is disposed between the first substrate and the second substrate to enclose the OLED.

An OLED display is manufactured by forming a plurality of OLED'S on a first mother board, cohering a second mother board, on which a sealant enclosing the OLED is formed, to the first mother board using a sealant, curing the sealant using a curing means such as a laser, and cutting the first mother board and the second mother board using a cutting means.

However, when curing the sealant, the sealant contracts, and there is a problem in that the second mother board, on which the sealant is formed, becomes twisted and deformed due to contraction of the sealant.

Particularly, when the second mother board and the sealant have different thermal expansion coefficients, twisting of the second mother board is worse, and thus upon performance of a cutting process for manufacturing the OLED display from the cohered first mother board and second mother board, the second mother board is damaged. Further, even when manufacturing the OLED display by cutting the OLED display from the cohered first mother board and second mother board, stress due to the twisting of the second mother board exists in the second substrate and thus there is a problem in that the second substrate is damaged even if only a weak external impact is applied.

The above information disclosed in this Background section is only provided for the enhancement of understanding of the background of the invention and therefore it may contain information that does not form a part of the prior art that is already known in this country to a person of ordinary skill in the art.

SUMMARY OF THE INVENTION

The present invention has been made in an effort to provide an OLED display, and a method of manufacturing the same, having the advantages of suppressing damages due to an external impact.

An exemplary embodiment of the present invention provides an OLED display including: a first substrate including an OLED; a second substrate that is opposite to the first substrate; a sealant that is positioned between the first substrate and the second substrate and that couples the first substrate and the second substrate; and a sealant contraction reinforcement auxiliary structure that is positioned in at least one of a position between the first substrate and the sealant, or in a position between the second substrate and the sealant, or in both positions.

The sealant contraction reinforcement auxiliary structure may be positioned only between the second substrate and the sealant.

The sealant contraction reinforcement auxiliary structure may contact the second substrate and the sealant.

A thermal expansion coefficient of the sealant contraction reinforcement auxiliary structure may be between a thermal expansion coefficient of the second substrate and a thermal expansion coefficient of the sealant.

The thermal expansion coefficient of the second substrate may be in the range of about $35 \times 10^{-6}$/K, to about $40 \times 10^{-6}$/K and the thermal expansion coefficient of the sealant may be in the range of about $65 \times 10^{-6}$/K, to about $70 \times 10^{-6}$/K.

The thermal expansion coefficient of the sealant contraction reinforcement auxiliary structure may be in the range of about $40 \times 10^{-6}$/K, to about $65 \times 10^{-6}$/K.

The sealant contraction reinforcement auxiliary structure may be positioned only between the first substrate and the sealant.

The sealant contraction reinforcement auxiliary structure may contact the first substrate and the sealant.

The thermal expansion coefficient of the sealant contraction reinforcement auxiliary structure may range between the thermal expansion coefficient of the first substrate and the thermal expansion coefficient of the sealant.

The sealant contraction reinforcement auxiliary structure may include a first sub-sealant contraction reinforcement auxiliary structure that is positioned between the first substrate and the sealant, and a second sub-sealant contraction reinforcement auxiliary structure that is positioned between the second substrate and the sealant.

The first sub-sealant contraction reinforcement auxiliary structure may contact the first substrate and the sealant, and the second sub-sealant contraction reinforcement auxiliary structure may contact the second substrate and the sealant.

A heat expansion coefficient of the first sub-sealant contraction reinforcement auxiliary structure may range between a thermal expansion coefficient of the first substrate and a thermal expansion coefficient of the sealant, and a heat expansion coefficient of the second sub-sealant contraction reinforcement auxiliary structure may range between a thermal expansion coefficient of the second substrate and a thermal expansion coefficient of the sealant.

The sealant contraction reinforcement auxiliary structure may be formed integrally with the second substrate and have a form that protrudes from the second substrate.

The sealant contraction reinforcement auxiliary structure may be formed by etching the second substrate using photolithography technology.

Another embodiment of the present invention provides a method of manufacturing an OLED display, the method including: preparing a first mother board including a plurality of OLED'S; forming a plurality of sealants that enclose a plurality of OLED'S, respectively, a plurality of sealant contraction reinforcement auxiliary structures that are positioned between the sealant and the second mother board, and a dummy structure that is adjacent to the sealant and that has the same height as that of the sealant on the second mother board; cohering the first mother board and the second mother board using the plurality of sealants so that the plurality of sealants enclose the plurality of OLED'S, respectively; curing the sealant; and cutting the first mother board and the second mother board along the outer side of the sealant.

The sealant contraction reinforcement auxiliary structure may contact the second mother board and the sealant.

The curing of the sealant may include laser irradiation of the sealant is through the second mother board and the sealant contraction reinforcement auxiliary structure.

A thermal expansion coefficient of the sealant contraction reinforcement auxiliary structure may range between a thermal expansion coefficient of the second mother board and a thermal expansion coefficient of the sealant.

The thermal expansion coefficient of the second mother board may be in the range of about $35 \times 10^{-6}$/K, to about $40 \times 10^{-6}$/K and the thermal expansion coefficient of the sealant may be in the range of about $65 \times 10^{-6}$/K, to about $70 \times 10^{-6}$/K.

The thermal expansion coefficient of the sealant contraction reinforcement auxiliary structure may be in the range of about $40 \times 10^{-6}$/K, to about $65 \times 10^{-6}$/K.

According to the present invention, an OLED display that is resistant to damage due to an external impact, and a method of manufacturing the OLED display are provided.

BRIEF DESCRIPTION OF THE DRAWINGS

FIG. 9 is a cross-sectional view of the OLED display taken along line IX-IX of FIG. 8.

FIG. 14 is a cross-sectional view illustrating an OLED display according to a fourth exemplary embodiment of the present invention.

DETAILED DESCRIPTION OF THE EMBODIMENTS

Figure 1:
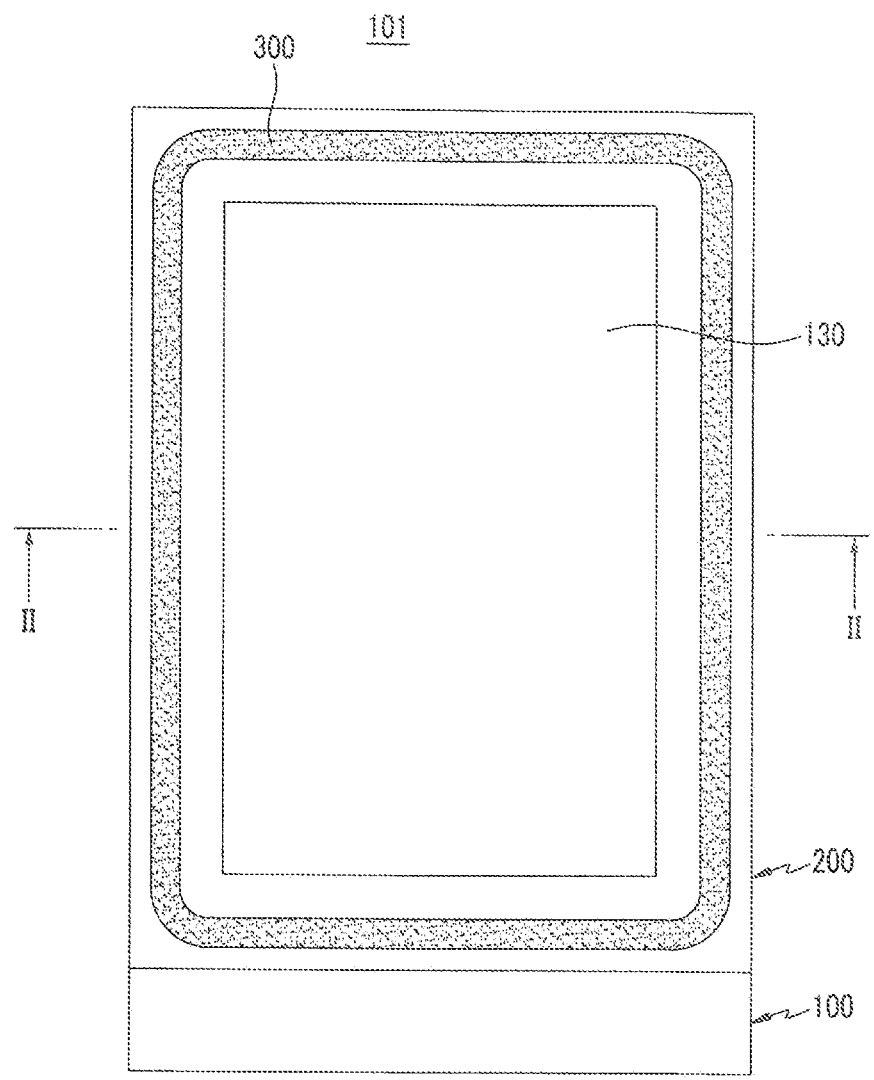
FIG. 1 is a top plan view of an OLED display according to a first exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Further, like reference numerals designate like elements in several exemplary embodiments and are representatively described in the first exemplary embodiment and elements different from those of the first exemplary embodiment will be described in other exemplary embodiments.

The drawings and description are to be regarded as illustrative in nature and not restrictive. Like reference numerals designate like elements throughout the specification.

Further, the size and thickness of each of the elements that are displayed in the drawings are described for better understanding and ease of description, and the present invention is not limited by the described size and thickness.

In the drawings, the thickness of layers, films, panels, regions, etc., are exaggerated for clarity. In the drawings, for better understanding and ease of description, thicknesses of some layers and areas are excessively displayed. When it is said that any part, such as a layer, film, region, or plate, is positioned on another part, it means the part is directly on the other part or above the other part with at least one intermediate part.

Further, in the accompanying drawings, an active matrix (AM) OLED display of a 2Tr-1Cap structure having two thin film transistors (TFT) and one capacitor in one pixel is described, but the present invention is not limited thereto. Therefore, in the OLED display, the quantity of TFT'S, the quantity of capacitors, and the quantity of wires are not limited. A pixel is a minimum unit that displays an image, and the OLED display displays an image through a plurality of pixels.

Hereinafter, an OLED display 101 according to a first exemplary embodiment of the present invention will be described with reference to FIGS. 1 to 4.

Figure 2:
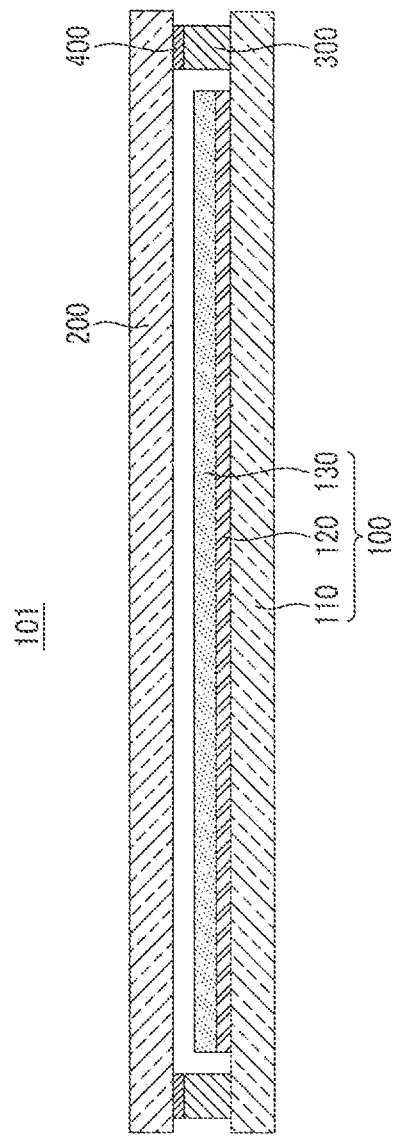
FIG. 2 is a cross-sectional view of the OLED display taken along line II-II of FIG. 1.

FIG. 1 is a top plan view of an OLED display according to a first exemplary embodiment of the present invention. FIG. 2 is a cross-sectional view of the OLED display taken along line II-II of FIG. 1.

As shown in FIGS. 1 and 2, the OLED display 101 according to the present exemplary embodiment includes a first substrate 100, a second substrate 200, a sealant 300, and a sealant contraction reinforcement auxiliary structure 400.

The first substrate 100 includes a substrate main body 110, a driving circuit 120, and an OLED 130.

The substrate main body 110 is formed with an insulation substrate that is formed with glass, quartz, ceramic, or plastic. However, in the present exemplary embodiment, the substrate main body 110 is not limited thereto and the substrate main body 110 may be formed with a metal substrate that is formed with stainless steel, etc.

The driving circuit 120 and the OLED 130 that are formed on the substrate main body 110 are positioned between the substrate main body 110 and the second substrate 200.

The driving circuit 120 includes first and second TFT'S 10 and 20 (shown in FIG. 3), and drives the OLED 130. The OLED 130 emits light according to a driving signal that is received from the driving circuit 120.

The second substrate 200 has a smaller width than that of the first substrate 100, and covers the first substrate 100. The second substrate 200 is formed with an insulation substrate that is formed with glass, quartz, ceramic, or plastic. It is preferable that the second substrate 200 is formed with an insulation substrate that is formed with glass, and in this case, the thermal expansion coefficient of the second substrate 200 is about $35 \times 10^{-6}$/K, to about $40 \times 10^{-6}$/K.

Hereinafter, an internal structure of the OLED display 101 will be described in detail with reference to FIGS. 3 and 4.

Figure 3:
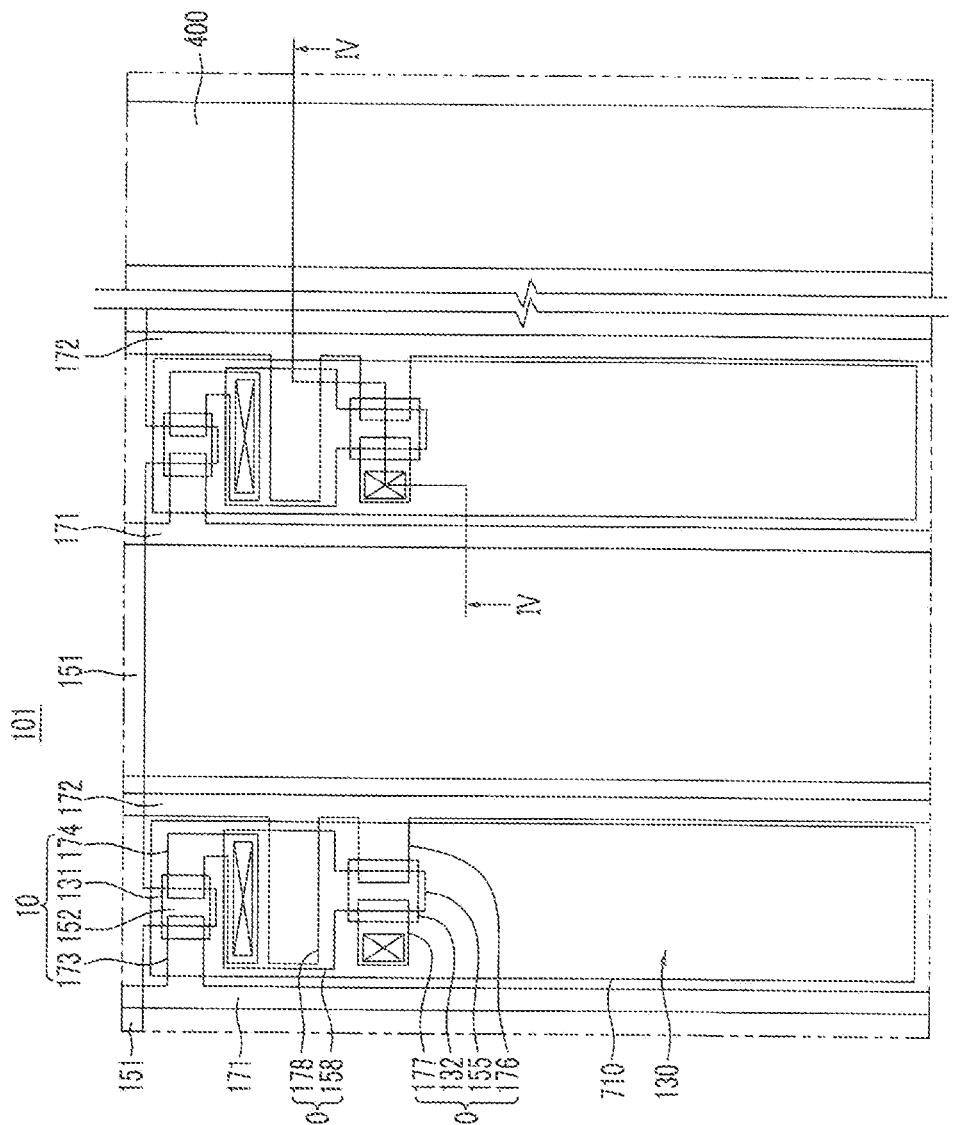
FIG. 3 is a layout view illustrating a structure of a pixel of an OLED display according to a first exemplary embodiment of the present invention.
Figure 4:
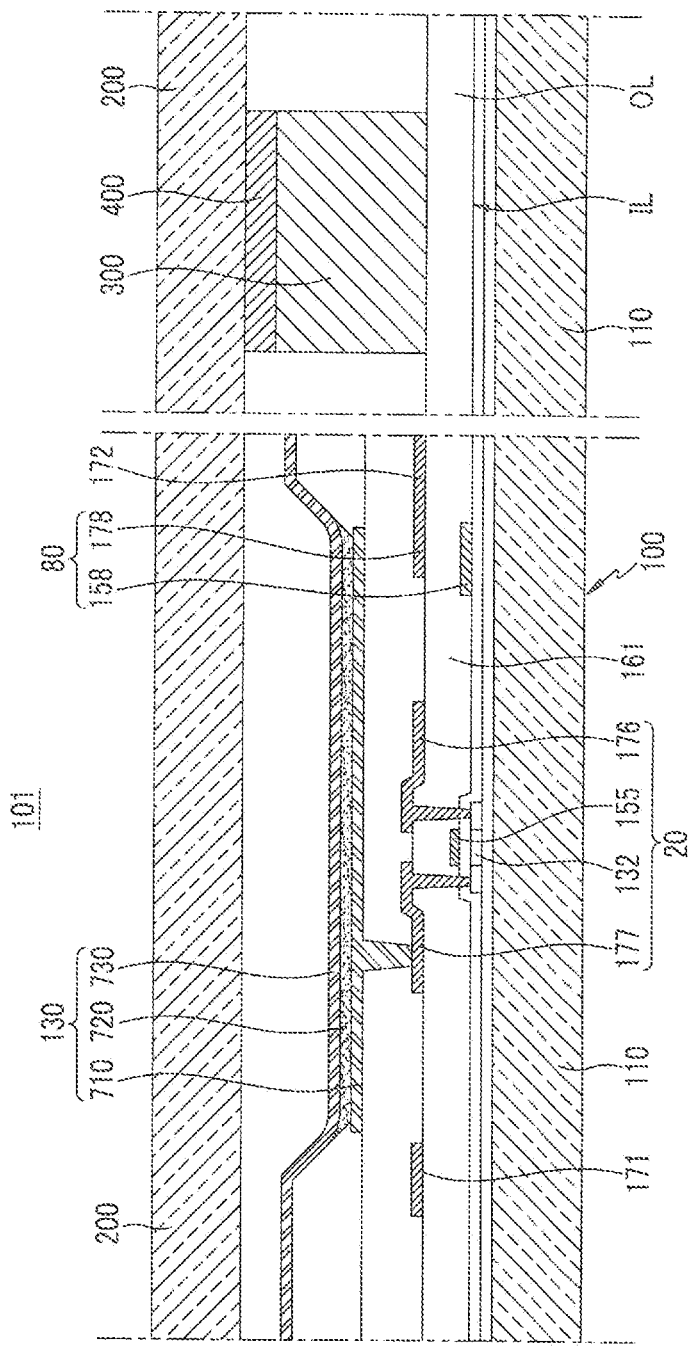
FIG. 4 is a cross-sectional view of the pixel taken along line IV-IV of FIG. 3.

A detailed structure of the OLED 130 and the driving circuit 120 to be described in detail hereinafter is shown in FIGS. 3 and 4, but an exemplary embodiment of the present invention is not limited to the structure that is shown in FIGS. 3 and 4. The OLED 130 and the driving circuit 120 can be formed in various structures within a range that can be easily modified by a person of ordinary skill in the art.

FIG. 3 is a layout view illustrating a structure of a pixel of an OLED display according to a first exemplary embodiment of the present invention. FIG. 4 is a cross-sectional view of the pixel taken along line IV-IV of FIG. 3.

As shown in FIGS. 3 and 4, the OLED display 101 includes a switching TFT 10, a driving TFT 20, a capacitor 80, and an OLED 130 that are each formed in each pixel. Here, a configuration including the switching TFT 10, the driving TFT 20, and the capacitor 80 is referred to as a driving circuit 120. The driving circuit 120 further includes a gate line 151 that is disposed in one direction of the substrate main body 110, and a data line 171 and a common power source line 172 that are insulated from and intersect the gate line 151. Here, a pixel is defined by the gate line 151, the data line 171, and the common power source line 172 as a boundary, but a pixel is not always limited thereto.

The OLED 130 includes a first electrode 710, an organic emission layer 720 that is formed on the first electrode 710, and a second electrode 730 that is formed on the organic emission layer 720. Here, the first electrode 710 is a positive (+) electrode, which is a hole injection electrode, and the second electrode 730 is a negative (−) electrode, which is an electron injection electrode. However, an exemplary embodiment of the present invention is not always limited thereto, and the first electrode 710 may be a negative electrode and the second electrode 730 may be a positive electrode according to a driving method of the display device 101. Holes and electrons are injected from the first electrode 710 and the second electrode 730, respectively, into the organic emission layer 720, and when exitons that are formed by coupling of holes and electrons that are injected into the organic emission layer 720 drop from an exited state to a ground state, the organic emission layer 720 emits light.

Further, the OLED display 101 according to the first exemplary embodiment of the present invention emits light in a direction of the second substrate 200. That is, the OLED 130 is a front light emitting type. Here, in order for the OLED 130 to emit light in a direction of the second substrate 200, the first electrode 710 is made of a light reflecting conducting material and the second electrode 730 is made of a light transmitting conducting material.

The capacitor 80 includes a pair of capacitor plates 158 and 178 that are disposed with an interlayer insulating layer 161 interposed therebetween. Here, the interlayer insulating layer 161 is a dielectric material, and capacity of the capacitor 80 is determined by charges that are stored in the capacitor 80 and a voltage between the capacitor plates 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177.

The switching TFT 10 is used as a switch for selecting a pixel to emit light. The switching gate electrode 152 is connected to the gate line 151. The switching source electrode 173 is connected to the data line 171. The switching drain electrode 174 is separated from the switching source electrode 173 and is connected to one capacitor plate 158.

The driving TFT 20 applies a driving power source for allowing light emission from the organic emission layer 720 of the OLED 130 within the selected pixel to the first electrode 710. The driving gate electrode 155 is connected to the capacitor plate 158 that is connected to the switching drain electrode 174. The driving source electrode 176 and the other capacitor plate 178 are each connected to the common power source line 172. The driving drain electrode 177 is connected to the first electrode 710 of the OLED 130 through a contact hole.

By such a structure, the switching TFT 10 operates by a gate voltage that is applied to the gate line 151 and thus performs a function of transferring a data voltage that is applied to the data line 171 to the driving TFT 20. A voltage corresponding to a difference between a common voltage that is applied from the common power source line 172 to the first driving TFT 20 and a data voltage that is transferred from the switching TFT 10 is stored in the capacitor 80, and a current corresponding to the voltage that is stored in the capacitor 80 flows to the OLED 140 through the driving TFT 20, whereby the OLED 140 emits light.

Referring again to FIGS. 1 to 4, the sealant 300 is positioned between the first substrate 100 and the second substrate 200, and is disposed along the edge of the first substrate 100 and the second substrate 200 to enclose the OLED 130. The sealant 300 coheres and seals the first substrate 100 and the second substrate 200. When the sealant 300 is cured to cohere and seal the first substrate 100 and the second substrate 200, the volume of the sealant 300 contracts. The sealant 300 can be cured by a curing means such as ultraviolet rays or a laser, and can have a form of a resin or frit according to the curing means. The heat expansion coefficient of the sealant 300 ranges from about $65 \times 10^{-6}$/K, to about $70 \times 10^{-6}$/K, which is different from that of the second substrate 200. The sealant 300 contacts the first substrate 100, and in a portion of the first substrate 100 that the sealant 300 contacts, an insulation layer IL is formed to contact the sealant 300, as shown in FIG. 4. In FIG. 4, the insulation layer IL contacting the sealant 300 is stacked as three layers, but the insulation layer IL of the present exemplary embodiment is not limited thereto and can be formed as 1, 2, or 4 or more layers.

When the sealant 300 contacts the first substrate 100, it is preferable that the sealant 300 contacts an organic layer OL of the insulation layer IL. Because the organic layer OL has flexibility, when the sealant 300 is cured and contracts, stress that forms in the organic layer OL contacting the sealant 300 due to contraction of the sealant 300, is relieved.

In another exemplary embodiment, the sealant 300 directly contacts the substrate main body 110 of the first substrate 100.

The sealant contraction reinforcement auxiliary structure 400 is positioned between the sealant 300 and the second substrate 200.

The sealant contraction reinforcement auxiliary structure 400 contacts the sealant 300 and the second substrate 200 between the sealant 300 and the second substrate 200. The height of the sealant contraction reinforcement auxiliary structure 400 is added to the height of the sealant 300 that is contracted upon curing of the sealant 300, and thus a first predetermined gap between the first substrate 100 and the second substrate 200 is sustained. That is, the height of the sealant contraction reinforcement auxiliary structure 400 compensates for the contracted height of the sealant 300, and even if the sealant 300 contracts, a gap between the first substrate 100 and the second substrate 200 is sustained due to the sealant contraction reinforcement auxiliary structure 400. A heat expansion coefficient of the sealant contraction reinforcement auxiliary structure 400 is between a thermal expansion coefficient of the second substrate 200 and a thermal expansion coefficient of the sealant 300. It is preferable that a thermal expansion coefficient of the sealant contraction reinforcement auxiliary structure 400 has a value between a thermal expansion coefficient of the second substrate 200 and a thermal expansion coefficient of the sealant 300, whereby the sealant contraction reinforcement auxiliary structure 400 relieves a thermal expansion degree of the second substrate 200 and a thermal expansion degree of the sealant 300 between the second substrate 200 and the sealant 300. In more detail, when the thermal expansion coefficient of the second substrate 200 is from about $35 \times 10^{-6}$/K, to about $40 \times 10^{-6}$/K and the thermal expansion coefficient of the sealant 300 is about $65 \times 10^{-6}$/K, to about $70 \times 10^{-6}$/K, the thermal expansion coefficient of the sealant contraction reinforcement auxiliary structure 400 is from about $40 \times 10^{-6}$/K, to about $65 \times 10^{-6}$/K, preferably about $52 \times 10^{-6}$/K, to about $53 \times 10^{-6}$/K, which is a value between the thermal expansion coefficient of the second substrate 200 and the thermal expansion coefficient of the sealant 300.

As an example, as the temperature rises 1K, when the second substrate 200 thermally expands by about $35 \times 10^{-6}$, to about $40 \times 10^{-6}$ and the sealant thermally expands by about $65 \times 10^{-6}$, to about $70 \times 10^{-6}$, if the second substrate 200 and the sealant 300 are in contact, the thermal expansion degree between the second substrate 200 and the sealant 300 is different and thus stress forms at an interface between the second substrate 200 and the sealant 300. Therefore, even if a weak external impact is applied, the second substrate 200 and the sealant 300 may be separated from each other, or the second substrate 200 or the sealant 300 may be damaged. Particularly, as the temperature rises, the thermal expansion difference between the second substrate 200 and the sealant 300 further increases. However, in the present exemplary embodiment, as the temperature rises 1K, when the second substrate 200 thermally expands by about $35 \times 10^{-6}$, to about $40 \times 10^{-6}$ and the sealant 300 thermally expands by about $65 \times 10^{-6}$, to about $70 \times 10^{-6}$, the sealant contraction reinforcement auxiliary structure 400 thermally expands by about $52 \times 10^{-6}$, to about $53 \times 10^{-6}$ between the second substrate 200 and the sealant 300, and thus the sealant contraction reinforcement auxiliary structure 400 reduces the thermal expansion difference between the second substrate 200 and the sealant 300. That is, as a thermal expansion coefficient of the sealant contraction reinforcement auxiliary structure 400 has an intermediate value between the thermal expansion coefficient of the sealant 300 and the thermal expansion coefficient of the second substrate 200, stress existing in an interface between the sealant contraction reinforcement auxiliary structure 400 and the sealant 300 and an interface between the sealant contraction reinforcement auxiliary structure 400 and the second substrate 200 is minimized, such that, the second substrate 200 and the sealant 300 are not separated from each other by a weak external impact, and the second substrate 200 or the sealant 300 is not damaged.

When the thermal expansion coefficient of the sealant contraction reinforcement auxiliary structure 400 is smaller than about $35 \times 10^{-6}$/K, to about $40 \times 10^{-6}$/K, which is the thermal expansion coefficient of the second substrate 200, the sealant contraction reinforcement auxiliary structure 400 cannot exhibit the above-described effect, and because the thermal expansion coefficient difference between the sealant contraction reinforcement auxiliary structure 400 and the sealant 300 is large, stress can exist at an interface between the sealant contraction reinforcement auxiliary structure 400 and the sealant 300. Thus even if a weak impact is applied, the sealant contraction reinforcement auxiliary structure 400 and the sealant 300 are separated from each other, or the sealant contraction reinforcement auxiliary structure 400 or the sealant 300 is damaged.

Further, when the thermal expansion coefficient of the sealant contraction reinforcement auxiliary structure 400 is larger than about $65 \times 10^{-6}$/K, to about $70 \times 10^{-6}$/K, which is the thermal expansion coefficient of the sealant 300, the sealant contraction reinforcement auxiliary structure 400 does not exhibit the above-described effect, and because the thermal expansion coefficient difference between the sealant contraction reinforcement auxiliary structure 400 and the second substrate 200 is large, stress forms at an interface between the sealant contraction reinforcement auxiliary structure 400 and the second substrate 200, and thus even if a weak impact is applied, the sealant contraction reinforcement auxiliary structure 400 and the second substrate 200 are separated from each other, or the sealant contraction reinforcement auxiliary structure 400 or the second substrate 200 is damaged.

As described above, in the OLED display 101 according to the first exemplary embodiment of the present invention, as the sealant contraction reinforcement auxiliary structure 400 is positioned between the second substrate 200 and the sealant 300, when the contracted height of the sealant 300 is compensated, stress existing at an interface between the sealant contraction reinforcement auxiliary structure 400 and the sealant 300 and an interface between the sealant contraction reinforcement auxiliary structure 400 and the second substrate 200 is minimized, and damage of the OLED display 101 due to an external impact is suppressed.

Hereinafter, a method of manufacturing the OLED display 101 according to a first exemplary embodiment of the present invention will be described with reference to FIGS. 5 to 11.

Figure 5:
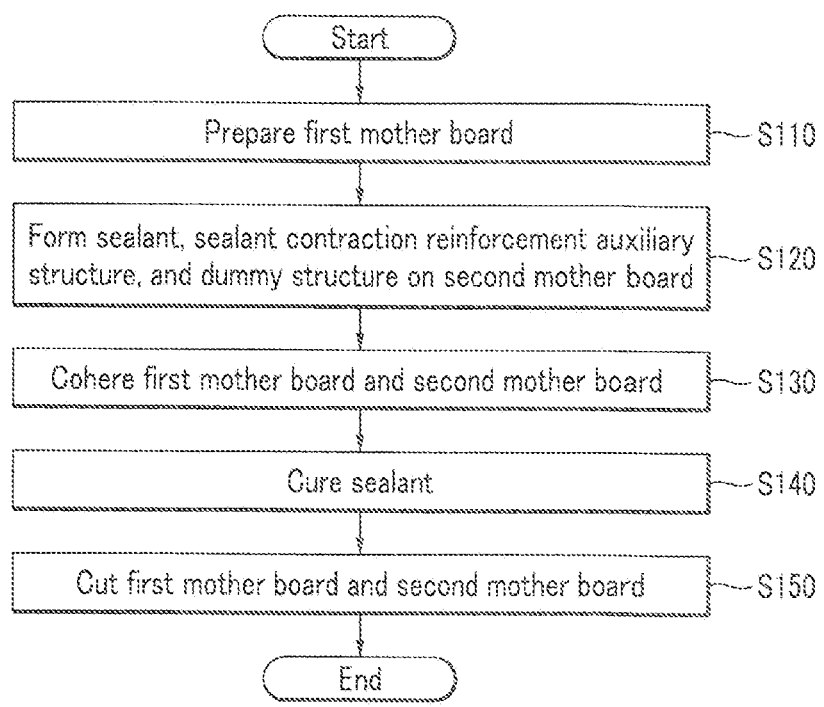
FIG. 5 is a flowchart illustrating a method of manufacturing an OLED display according to a first exemplary embodiment of the present invention.

FIG. 5 is a flowchart illustrating a method of manufacturing an OLED display according to a first exemplary embodiment of the present invention. FIGS. 6 to 11 are views illustrating a method of manufacturing an OLED display according to a first exemplary embodiment of the present invention. Here, FIG. 9 is a cross-sectional view of the OLED display taken along line IX-IX of FIG. 8.

Figure 6:
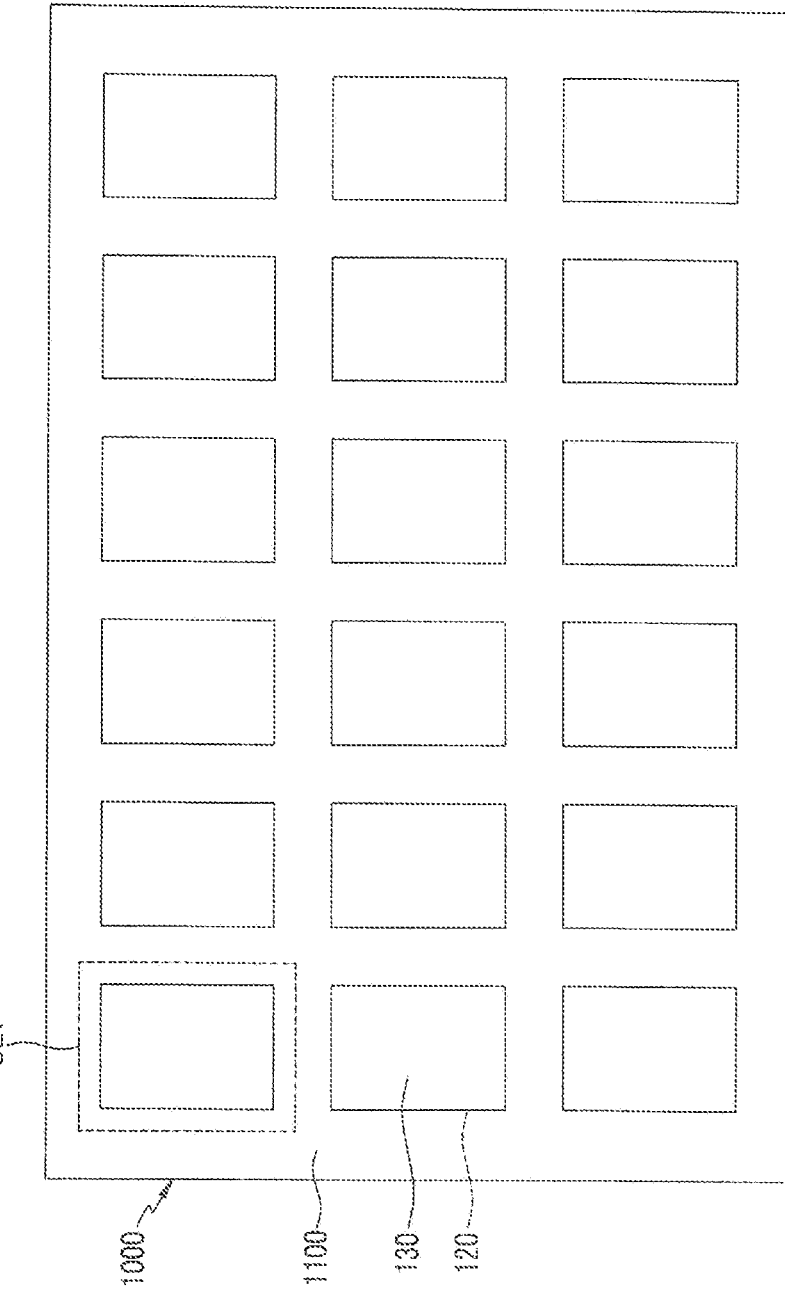
FIGS. 6 to 11 are views illustrating a method of manufacturing an OLED display according to a first exemplary embodiment of the present invention. Here.

First, as shown in FIGS. 5 and 6, a first mother board 1000 is prepared (S110).

Specifically, by forming a plurality of driving circuits 120 and a plurality of OLEDS 130 in a first mother board main body 1100, the first mother board 1000 including the plurality of driving circuits 120 and the plurality of OLEDS 130 is prepared. Here, by cutting the first mother board 1000 along a virtual first cutting line CL1, a first substrate 100 is formed from the first mother board 1000.

Figure 7:
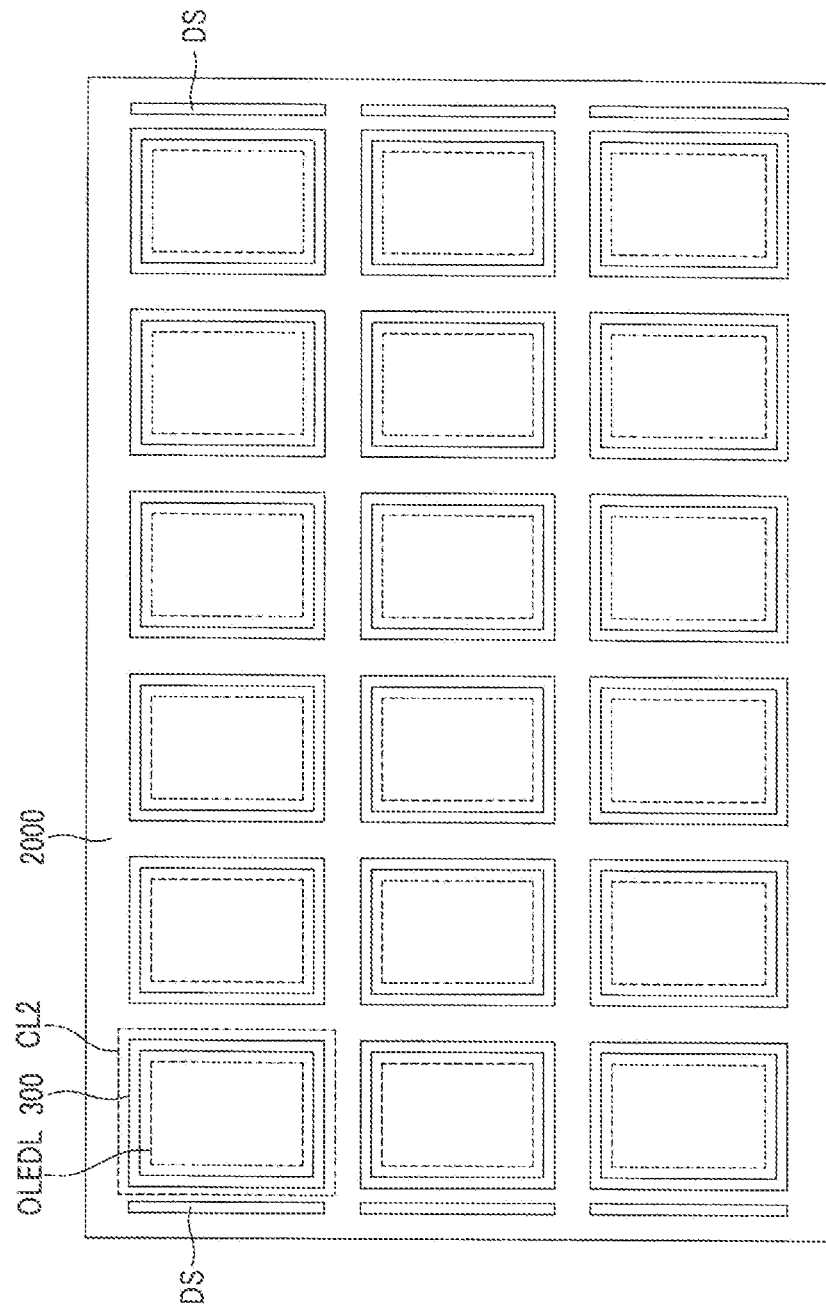

Next, as shown in FIG. 7, a sealant 300, a sealant contraction reinforcement auxiliary structure 400, and a dummy structure DS are formed on a second mother board 2000 (S120).

Specifically, a plurality of sealants 300 that enclose a virtual OLED line (OLEDL) corresponding to the OLED 130 to enclose each of a plurality of OLED'S 130, a plurality of sealant contraction reinforcement auxiliary structures 400 that are positioned between the plurality of sealants 300 and the second mother board 2000, and a dummy structure DS that is adjacent to the outermost sealant 300 to have the same height as that of the sealant 300, are formed on the second mother board 2000. Here, when the second mother board 2000 is cut along a virtual second cutting line CL2, a second substrate 200 is formed from the second mother board 2000, and the sealant contraction reinforcement auxiliary structure 400 contacts the sealant 300 and the second mother board 2000. When the second mother board 2000 is disposed opposite to the first mother board 1000 on the first mother board 1000, the dummy structure DS performs a function of maintaining a gap between the first mother board 1000 and the second mother board 2000. A heat expansion coefficient of the second mother board 2000 is about $35 \times 10^{-6}$/K, to about $40 \times 10^{-6}$/K, a thermal expansion coefficient of the sealant 300 is about $65 \times 10^{-6}$/K, to about $70 \times 10^{-6}$/K, and a thermal expansion coefficient of the sealant contraction reinforcement auxiliary structure 400 is about $40 \times 10^{-6}$/K, to about $65 \times 10^{-6}$/K, which is between a thermal expansion coefficient of the second mother board 2000 and a thermal expansion coefficient of the sealant 300.

In another exemplary embodiment, a forming position of the dummy structure DS is not limited, and the dummy structure DS can be formed between neighboring sealants 300, or the dummy structure DS can be formed to enclose the virtual second cutting line CL2 or to enclose a plurality of sealants 300 along an edge area of the second mother board 2000.

Figure 8:
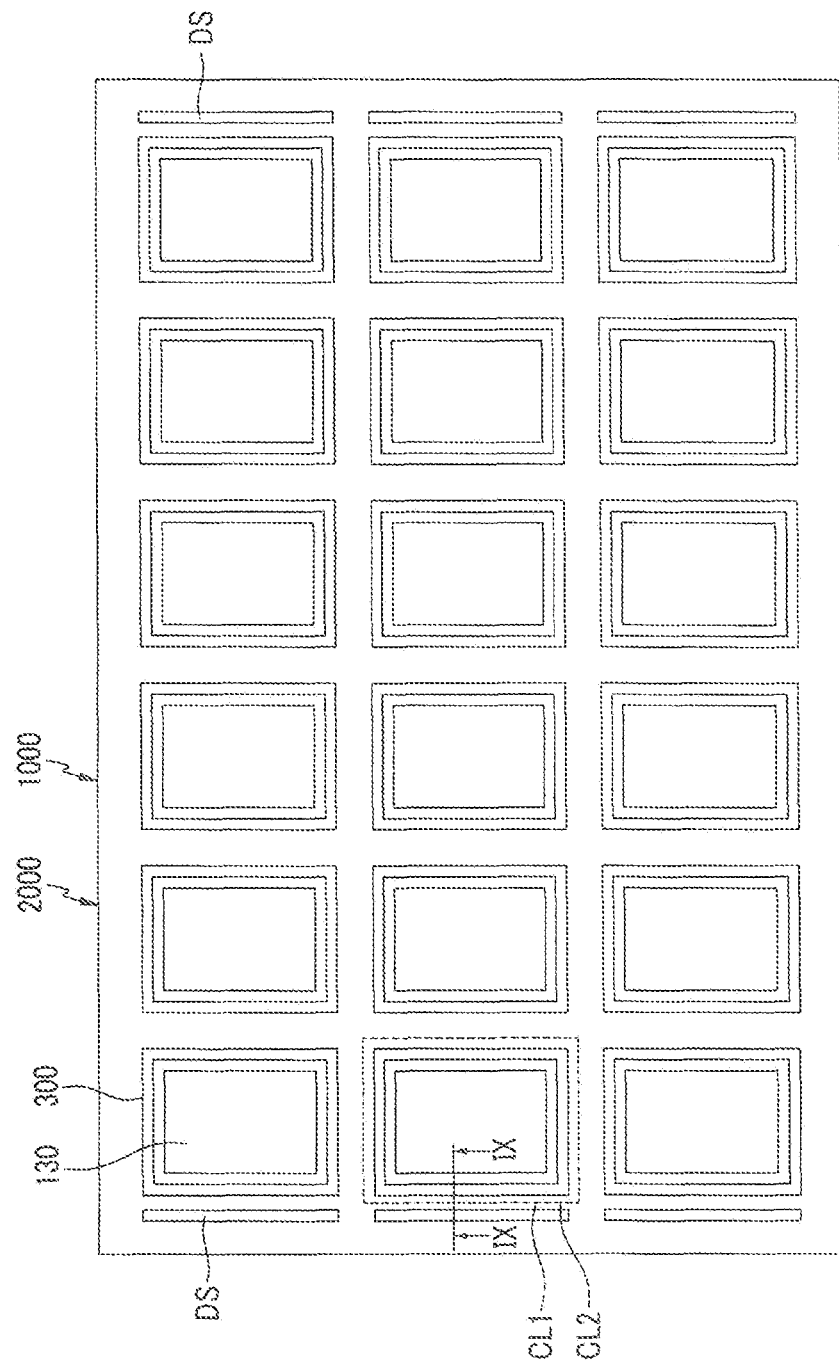
Figure 9:
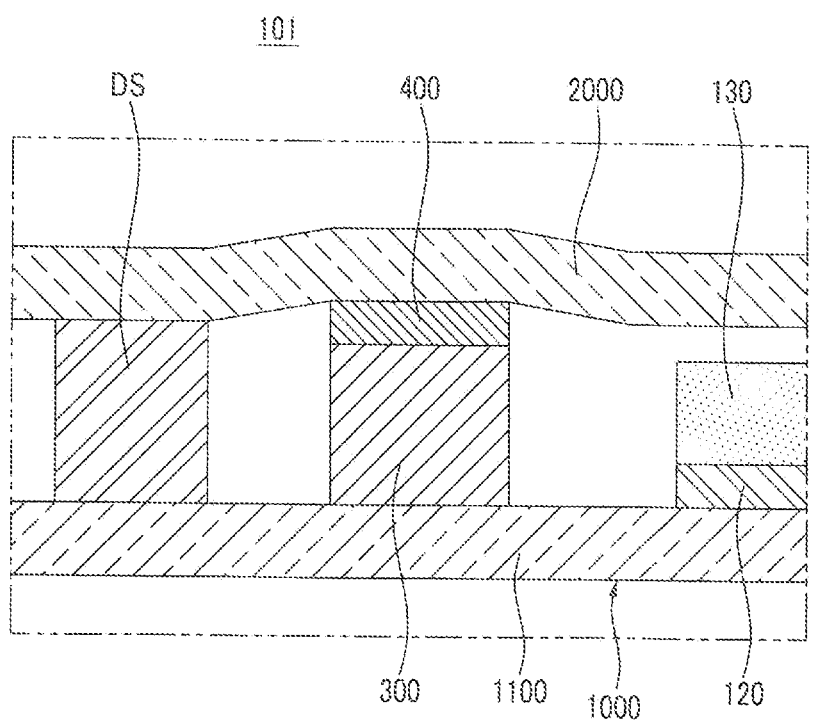

Next, as shown in FIGS. 8 and 9, the first mother board 1000 and the second mother board 2000 are cohered (S130).

Specifically, by aligning the second mother board 2000 on the first mother board 1000, the second mother board 2000 is arranged opposite to the first mother board 1000. In this case, a plurality of sealants 300 enclose a plurality of OLED'S 130, respectively, and the sealant 300 and the dummy structure DS contact the first mother board 1000. The sealant 300 and the dummy structure DS have the same height and the sealant contraction reinforcement auxiliary structure 400 is positioned between the sealant 300 and the second mother board 2000, and thus a portion of the second mother board 2000 corresponding to the sealant 300 protrudes upward.

Figure 10:
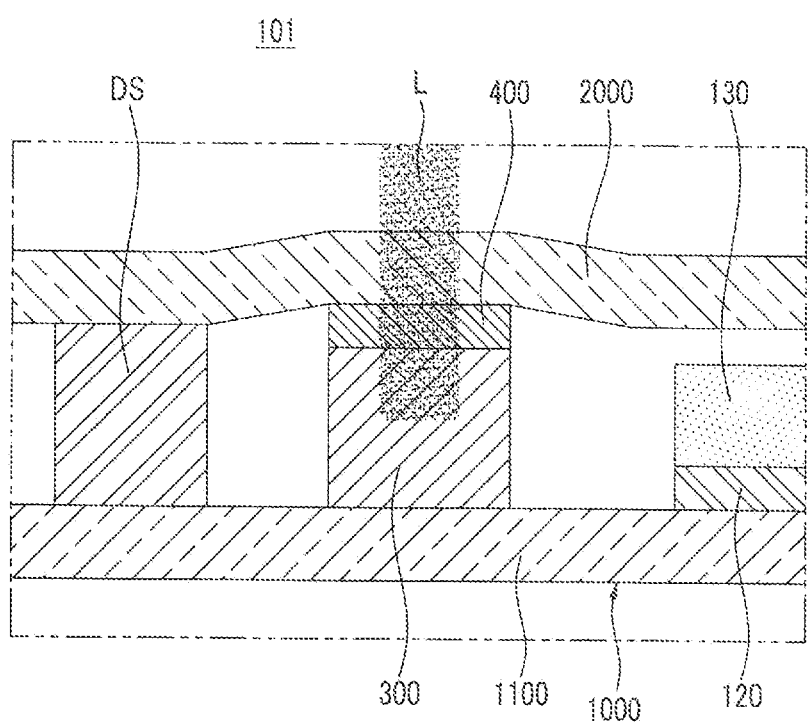
Figure 11:
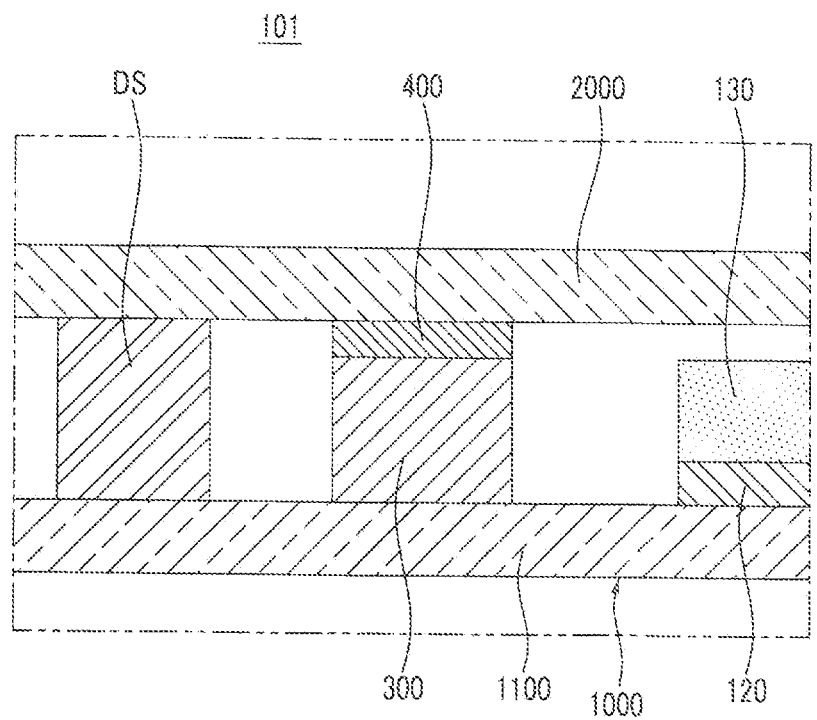

Next, as shown in FIGS. 10 and 11, the sealant 300 is cured (S140).

Specifically, by radiating a laser to the sealant 300 through the second mother board 2000 and the sealant contraction reinforcement auxiliary structure 400, the sealant 300 is cured. As the sealant 300 is cured, the sealant 300 contracts, and as shown in FIG. 11, the entire height of the sealant 300 and the sealant contraction reinforcement auxiliary structure 400 becomes equal to that of the dummy structure DS, whereby a surface of the second mother board 2000 forms a flat state.

In this way, as the sealant contraction reinforcement auxiliary structure 400 compensates for a height decrease of the sealant 300 due to contraction of the sealant 300, a surface of the second mother board 2000 corresponding to the sealant 300 forms a flat state. That is, stress is suppressed from being present in the surface of the second mother board 2000 corresponding to the sealant 300 due to contraction of the sealant 300.

Further, as a thermal expansion coefficient of the sealant contraction reinforcement auxiliary structure 400 has an intermediate value between the thermal expansion coefficient of the sealant 300 and the thermal expansion coefficient of the second mother board 2000, stress present at an interface between the sealant 300 and the sealant contraction reinforcement auxiliary structure 400 that thermally expands by a laser, which is a curing means of the sealant 300, and an interface between the sealant contraction reinforcement auxiliary structure 400 and the second mother board 2000, is minimized.

Next, the first mother board 1000 and the second mother board 2000 are cut (S150).

Specifically, by cutting the first mother board 1000 and the second mother board 2000 along the first cutting line CL1 and the second cutting line CL2 of the outer side of the sealant 300, a plurality of OLED displays 101 according to the first exemplary embodiment are manufactured from the first mother board 1000 and the second mother board 2000. In this case, the second mother board 2000 is in a flat state, and stress due to thermal expansion is minimized at each interface between the second mother board 2000 and the sealant contraction reinforcement auxiliary structure 400 and between the sealant contraction reinforcement auxiliary structure 400 and the sealant 300, such that, upon cutting the first mother board 1000 and the second mother board 2000, the second mother board 2000 or the sealant 300 is not unintentionally damaged due to impact by cutting.

As described above, in a method of manufacturing the OLED display 101 according to the first exemplary embodiment of the present invention, the second mother board 2000 and the sealant 300 are suppressed from being damaged due to an impact by cutting upon a cutting process, whereby production yield is improved and production cost is reduced.

Further, because stress existing at an interface between the sealant contraction reinforcement auxiliary structure 400 and the sealant 300 and an interface between the sealant contraction reinforcement auxiliary structure 400 and the second substrate 200 of the OLED display 101 that is manufactured by being cut from the first mother board 1000 and the second mother board 2000 is minimized, when undergoing a weak external impact, the second substrate 200 and the sealant 300 are not separated from each other and the second substrate 200 or the sealant 300 is not damaged. In addition, the structure of the sealant contraction reinforcement auxiliary structure 400 may be the same as that of the sealant 300, and the cross-section may be a rectangle or a trapezoid with the side facing the second mother board 2000 being shorter. In addition, the material for the sealant contraction reinforcement auxiliary structure may include oxide compounds comprising V, Te, or Zr.

Hereinafter, an OLED display 102 according to a second exemplary embodiment of the present invention will be described with reference to FIG. 12.

Figure 12:
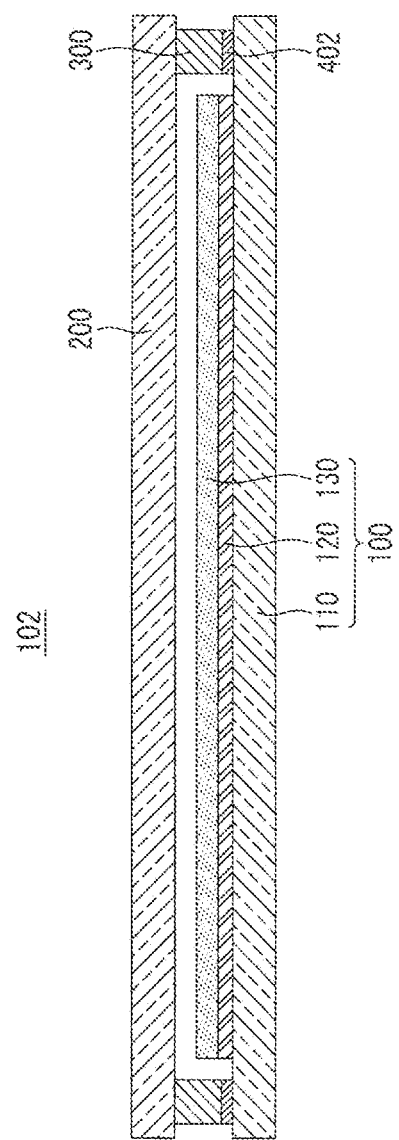
FIG. 12 is a cross-sectional view illustrating an OLED display according to a second exemplary embodiment of the present invention.

FIG. 12 is a cross-sectional view illustrating an OLED display according to a second exemplary embodiment of the present invention.

As shown in FIG. 12, a sealant 300 of an OLED display 102 according to the present second exemplary embodiment contacts a second substrate 200.

A sealant contraction reinforcement auxiliary structure 402 is positioned between the sealant 300 and the first substrate 100.

The sealant contraction reinforcement auxiliary structure 402 contacts the sealant 300 and the first substrate 100 between the sealant 300 and the first substrate 100. The height of the sealant contraction reinforcement auxiliary structure 402 is added to the height of the sealant 300 that contracts upon curing of the sealant 300, and thus a first predetermined gap between the first substrate 100 and the second substrate 200 is sustained. That is, the height of the sealant contraction reinforcement auxiliary structure 402 is the height that compensates the contracted height of the sealant 300, and even if the sealant 300 contracts, a gap between the first substrate 100 and the second substrate 200 is maintained due to the sealant contraction reinforcement auxiliary structure 402. The heat expansion coefficient of the sealant contraction reinforcement auxiliary structure 402 is between the thermal expansion coefficient of the first substrate 100 and the thermal expansion coefficient of the sealant 300. It is preferable that the thermal expansion coefficient of the sealant contraction reinforcement auxiliary structure 402 has a value between the thermal expansion coefficient of the first substrate 100 and the thermal expansion coefficient of the sealant 300, whereby the sealant contraction reinforcement auxiliary structure 402 relieves a thermal expansion degree of the first substrate 100, and a thermal expansion degree of the sealant 300 between the first substrate 100 and the sealant 300.

As described above, in the OLED display 102 according to the second exemplary embodiment of the present invention, as the sealant contraction reinforcement auxiliary structure 402 is positioned between the first substrate 100 and the sealant 300, while the contracted height of the sealant 300 is compensated, stress existing at an interface between the sealant contraction reinforcement auxiliary structure 402 and the sealant 300 and the interface between the sealant contraction reinforcement auxiliary structure 402 and the first substrate 100 is minimized, whereby damage of the OLED display 102 due to an external impact is suppressed. In addition, the structure of the sealant contraction reinforcement auxiliary structure 402 may be the same as that of the sealant 300, and the cross-section may be a rectangle or a trapezoid with the side facing the second mother board 2000 being shorter. In addition, the material for the sealant contraction reinforcement auxiliary structure may include oxide compounds comprising V, Te, or Zr.

Hereinafter, an OLED display 103 according to a third exemplary embodiment of the present invention will be described with reference to FIG. 13.

Figure 13:
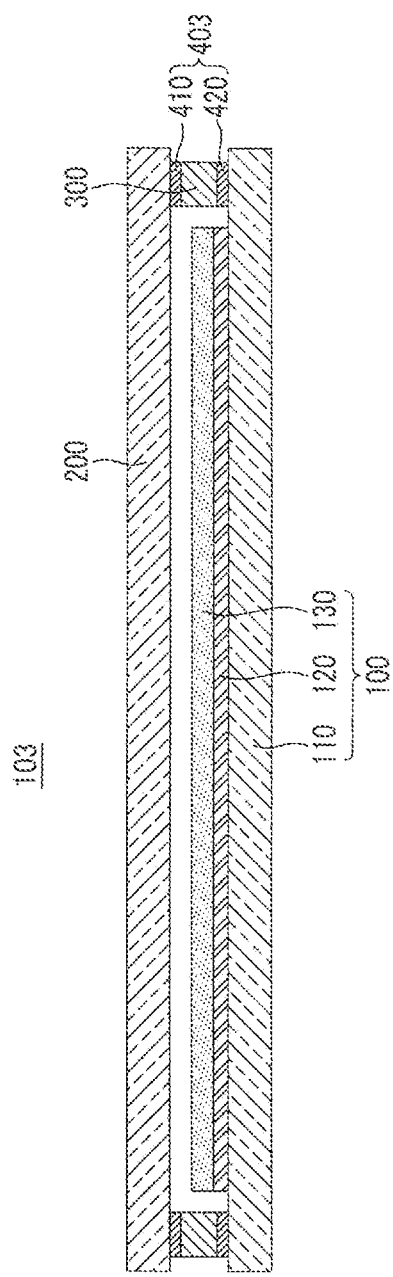
FIG. 13 is a cross-sectional view illustrating an OLED display according to a third exemplary embodiment of the present invention.

FIG. 13 is a cross-sectional view illustrating an OLED display according to a third exemplary embodiment of the present invention.

As shown in FIG. 13, a sealant 300 of the OLED display 103 according to the present exemplary embodiment is positioned between a first substrate 100 and a second substrate 200. The sealant 300 contacts a sealant contraction reinforcement auxiliary structure 403.

The sealant contraction reinforcement auxiliary structure 403 includes a first sub-sealant contraction reinforcement auxiliary structure 410 and a second sub-sealant contraction reinforcement auxiliary structure 420.

The first sub-sealant contraction reinforcement auxiliary structure 410 contacts the sealant 300 and the second substrate 200 between the sealant 300 and the second substrate 200, and the second sub-sealant contraction reinforcement auxiliary structure 420 contacts the sealant 300 and the first substrate 100 between the sealant 300 and the first substrate 100. The entire height of the first sub-sealant contraction reinforcement auxiliary structure 410 and the second sub-sealant contraction reinforcement auxiliary structure 420 is added to the height of the sealant 300 that contracts upon curing of the sealant 300, and thus a first predetermined height between the first substrate 100 and the second substrate 200 is sustained. That is, the entire height of the first sub-sealant contraction reinforcement auxiliary structure 410 and the second sub-sealant contraction reinforcement auxiliary structure 420 compensates for the contracted height of the sealant 300, and even if the sealant 300 contracts, due to the first sub-sealant contraction reinforcement auxiliary structure 410 and the second sub-sealant contraction reinforcement auxiliary structure 420, the gap between the first substrate 100 and the second substrate 200 is sustained. The heat expansion coefficient of the first sub-sealant contraction reinforcement auxiliary structure 410 is between the thermal expansion coefficient of the second substrate 200 and the thermal expansion coefficient of the sealant 300. It is preferable that the heat expansion coefficient of the first sub-sealant contraction reinforcement auxiliary structure 410 has a value between the thermal expansion coefficient of the second substrate 200 and the thermal expansion coefficient of the sealant 300. The heat expansion coefficient of the second sub-sealant contraction reinforcement auxiliary structure 420 is between the thermal expansion coefficient of the first substrate 100 and the thermal expansion coefficient of the sealant 300. It is preferable that the heat expansion coefficient of the second sub-sealant contraction reinforcement auxiliary structure 420 has a value between the thermal expansion coefficient of the first substrate 100 and the thermal expansion coefficient of the sealant 300. Thereby, each of the first sub-sealant contraction reinforcement auxiliary structure 410 and the second sub-sealant contraction reinforcement auxiliary structure 420 relieves a thermal expansion degree of the first substrate 100, the sealant 300, and the second substrate 200 at each of a position between the second substrate 200 and the sealant 300 and a position between the first substrate 100 and the sealant 300.

As described above, in an OLED display 103 according to a third exemplary embodiment of the present invention, as the sealant contraction reinforcement auxiliary structure 403 including the first sub-sealant contraction reinforcement auxiliary structure 410 and the second sub-sealant contraction reinforcement auxiliary structure 420 is positioned between the second substrate 200 and the sealant 300 and between the first substrate 100 and the sealant 300, while the contracted height of the sealant 300 is compensated, stress existing in each interface between the first sub-sealant contraction reinforcement auxiliary structure 410 and the second substrate 200, between the first sub-sealant contraction reinforcement auxiliary structure 410 and the sealant 300, between the second sub-sealant contraction reinforcement auxiliary structure 420 and the first substrate 100, and between the second sub-sealant contraction reinforcement auxiliary structure 420 and the sealant 300 is minimized, and thus damage to the OLED display 103 due to an external impact is suppressed. In addition, the structure of the sealant contraction reinforcement auxiliary structure 420 may be the same as that of the sealant 300, and the cross-section may be a rectangle or a trapezoid with the side facing the second mother board 2000 being shorter. In addition, the material for the sealant contraction reinforcement auxiliary structure may include oxide compounds comprising V, Te, or Zr.

Hereinafter, an OLED display 104 according to a fourth exemplary embodiment of the present invention will be described with reference to FIG. 14.

FIG. 14 is a cross-sectional view illustrating an OLED display according to a fourth exemplary embodiment of the present invention.

As shown in FIG. 14, a sealant contraction reinforcement auxiliary structure 404 of an OLED display 104 according to the present exemplary embodiment is integrally formed with a second substrate 200, and has a form that protrudes from the second substrate 200.

The sealant contraction reinforcement auxiliary structure 404 can be formed by etching the second substrate 200 using photolithography technology. In more detail, after forming a photoresist layer on the second substrate 200 and exposing the photoresist layer using a mask, by developing the photoresist layer, a photoresist pattern that is positioned at an area corresponding to the sealant contraction reinforcement auxiliary structure 404 is formed on the second substrate 200. Thereafter, by etching a portion of the second substrate 200 that is exposed by the photoresist pattern using a wet etching or dry etching process, the sealant contraction reinforcement auxiliary structure 404 of a form that protrudes from the second substrate 200 is formed.

Further, by doping impurities to the sealant contraction reinforcement auxiliary structure 404, or by performing a heat treatment of the sealant contraction reinforcement auxiliary structure 404, a thermal expansion coefficient of the sealant contraction reinforcement auxiliary structure 404 can be adjusted to be between a thermal expansion coefficient of the second substrate 200 and a thermal expansion coefficient of a sealant 300. In this case, it is preferable to adjust the thermal expansion coefficient of the sealant contraction reinforcement auxiliary structure 404 to a value between the thermal expansion coefficient of the first substrate 100 and the thermal expansion coefficient of the sealant 300, whereby the sealant contraction reinforcement auxiliary structure 404 relieves a thermal expansion degree of the second substrate 200 and a thermal expansion degree of the sealant 300 between the second substrate 200 and the sealant 300.

As described above, in the OLED display 104 according to a fourth exemplary embodiment of the present invention, as the sealant contraction reinforcement auxiliary structure 404 is positioned between the second substrate 200 and the sealant 300, while the contracted height of the sealant 300 is compensated, stress existing at an interface between the sealant contraction reinforcement auxiliary structure 404 and the sealant 300 and an interface between the sealant contraction reinforcement auxiliary structure 404 and the second substrate 200 is minimized, and thus damage of the OLED display 104 due to an external impact is suppressed. In addition, the structure of the sealant contraction reinforcement auxiliary structure 404 may be the same as that of the sealant 300, and the cross-section may be a rectangle or a trapezoid with the side facing the second mother board 2000 being shorter. In addition, the material for the sealant contraction reinforcement auxiliary structure may include oxide compounds comprising V, Te, or Zr.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display device, comprising:
    a first substrate comprising an OLED;
    a second substrate that is opposite to the first substrate;
    a sealant that is positioned between the first substrate and the second substrate and that couples the first substrate and the second substrate; and
    a sealant contraction reinforcement auxiliary structure, that is positioned in a position between the first substrate and the sealant or a position between the second substrate and the sealant, or in both positions,
    wherein a thermal expansion coefficient of the sealant contraction reinforcement auxiliary structure is less than a thermal expansion coefficient of the sealant,
    wherein the thermal expansion coefficient of the sealant contraction reinforcement auxiliary structure is between about $40\times10^{-6}$/K, to about $65\times10^{-6}$/K.

2. The OLED display device of claim 1, wherein the sealant contraction reinforcement auxiliary structure is positioned only between the second substrate and the sealant.

3. The OLED display device of claim 2, wherein the sealant contraction reinforcement auxiliary structure contacts the second substrate and the sealant.

4. The OLED display device of claim 3, wherein the thermal expansion coefficient of the sealant contraction reinforcement auxiliary structure is greater than or equal to a thermal expansion coefficient of the second substrate.

5. The OLED display device of claim 4, wherein the thermal expansion coefficient of the second substrate is between about $3\times10^{-6}$/K, to about $40\times10^{-6}$/K and the thermal expansion coefficient of the sealant is between about $65\times10^{-6}$/K, to about $70\times10^{-6}$/K.

6. The OLED display device of claim 1, wherein the sealant contraction reinforcement auxiliary structure is positioned only between the first substrate and the sealant.

7. The OLED display device of claim 6, wherein the sealant contraction reinforcement auxiliary structure contacts the first substrate and the sealant.

8. The OLED display device of claim 7, wherein the thermal expansion coefficient of the sealant contraction reinforcement auxiliary structure is greater than or equal to the thermal expansion coefficient of the first substrate.

9. The OLED display device of claim 1, wherein the sealant contraction reinforcement auxiliary structure comprises:
    a first sub-sealant contraction reinforcement auxiliary structure that is positioned between the first substrate and the sealant; and
    a second sub-sealant contraction reinforcement auxiliary structure that is positioned between the second substrate and the sealant.

10. The OLED display device of claim 9, wherein the first sub-sealant contraction reinforcement auxiliary structure contacts the first substrate and the sealant, and
    the second sub-sealant contraction reinforcement auxiliary structure contacts the second substrate and the sealant.

11. The OLED display device of claim 10, wherein a heat expansion coefficient of the first sub-sealant contraction reinforcement auxiliary structure is greater than or equal to a thermal expansion coefficient of the first substrate, and
    a heat expansion coefficient of the second sub-sealant contraction reinforcement auxiliary structure is greater than or equal to a thermal expansion coefficient of the second substrate.

12. The OLED display device of claim 1, wherein the sealant contraction reinforcement auxiliary structure is formed integrally with the second substrate, and has a form that protrudes from the second substrate.

13. The OLED display device of claim 12, wherein the sealant contraction reinforcement auxiliary structure is formed by etching the second substrate using photolithography.

14. A method of manufacturing an OLED display device, the method comprising:
    preparing a first mother board comprising a plurality of OLEDs;
    forming a plurality of sealants that enclose a plurality of OLEDs, respectively, a plurality of sealant contraction reinforcement auxiliary structures that are positioned between the sealant and the second mother board, and a dummy structure that is adjacent to the sealant and that has the same height as that of the sealant on the second mother board;
    cohering the first mother board and the second mother board using the plurality of sealants so that the plurality of sealants enclose the plurality of OLEDs, respectively;
    curing the sealant; and
    cutting the first mother board and the second mother board along the outer side of the sealant,
    wherein a thermal expansion coefficient of the sealant contraction reinforcement auxiliary structure is less than a thermal expansion coefficient of the sealant,
    wherein the thermal expansion coefficient of the sealant contraction reinforcement auxiliary structure is between about $40\times10^{-6}$/K, to about $65\times10^{-6}$/K.

15. The method of claim 14, wherein the sealant contraction reinforcement auxiliary structure contacts the second mother board and the sealant.

16. The method of claim 14, wherein the curing of the sealant comprises radiating a laser to the sealant through the second mother board and the sealant contraction reinforcement auxiliary structure.

17. The method of claim 16, wherein the thermal expansion coefficient of the sealant contraction reinforcement auxiliary structure is greater than or equal to a thermal expansion coefficient of the second mother board.

18. The method of claim 17, wherein the thermal expansion coefficient of the second mother board is between about $35 \times 10^{-6}$/K, to about $40 \times 10^{-6}$/K, and the thermal expansion coefficient of the sealant is between about $65 \times 10^{-6}$/K, to about $70 \times 10^{-6}$/K.

* * * * *